(12) United States Patent
Wortman

(10) Patent No.: US 6,680,852 B1
(45) Date of Patent: Jan. 20, 2004

(54) COLOR-CODING TECHNIQUE FOR SLOT SELECTION IN BLADED SYSTEMS

(75) Inventor: Michael Wortman, Sacramento, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/262,220

(22) Filed: Sep. 30, 2002

(51) Int. Cl.[7] .............................. H05K 5/04; H05K 5/00
(52) U.S. Cl. ..................... 361/752; 361/797; 361/633; 361/724; 348/705; 348/722; 348/489
(58) Field of Search ............................... 361/752, 724, 361/822, 633; 710/100; 348/705, 488, 489, 722

(56) References Cited
U.S. PATENT DOCUMENTS 5,990,981 A * 11/1999 Thompson et al. ......... 348/705

6,311,229 B1 * 10/2001 Burchard et al. .............. 710/2

* cited by examiner

Primary Examiner—Randy Gibson
Assistant Examiner—Hung Bui

(57) ABSTRACT

A method of color-coding a blade and a bladed system is disclosed. The bladed system has a plurality of slots. In particular, the method facilitates selecting at least one slot for inserting therein the blade. One of a plurality of core colors is associated with each slot of the bladed system, whereas each core color indicates which type of blade can be inserted in the corresponding slot. One of the core colors is associated with the blade. In the bladed system, a slot which has an associated core color which matches the core color of the blade is selected. The blade is inserted in the selected slot.

21 Claims, 7 Drawing Sheets

Blade Color/ Glyph Table
100

| | Standard Reference Glyph (10) | New Glyph (20) | Blade Bulkhead Label Color (30) | DESCRIPTION (40) |
|---|---|---|---|---|
| 51 | △ | △ | | (TRIANGLE) CompactPCI System-Only Slot/Board |
| | ○ | ○ | | (CIRCLE) CompactPCI Peripheral-Only Slot/Board |
| | ○△ | ○△ | | (CIRCLE-TRIANGLE) CompactPCI System-Peripheral Slot/Board |
| 52 | ⚌ | ⚌ | Light Green | Fabric-Only Slot/Board |
| | ⁝ | ⁝ | | Dual Link Port Node-Only Slot/Board |
| | • | • | | Single Link Port Node-Only Slot/Board |
| 53 | ⧓ | ⧓ | Light Blue | CompactPCI System + Dual Link Port Node Slot/Board |
| | △ | △ | | CompactPCI System + Single Link Port Node Slot/Board |
| 53A | ○⧓ | ○⧓ | | CompactPCI Peripheral + Dual Link Port Node Slot/Board |
| | ○△ | ○△ | | CompactPCI Peripheral + Single Link Port Node Slot/Board |
| 54 | ○⧓ | ○⧓ | Light Blue | CompactPCI System-Peripheral + Dual Link Port Node Board |
| 54A | ○△ | ○△ | | CompactPCI System-Peripheral + Single Link Port Node Board |
| 55 | | □ | Flint Gray | System Management Blade |
| 56 | | ◇ | Pewter Gray | System Management Blade-Rear Transition Module |
| 57 | | ▷ | Light Purple | System Blade-Rear Transition Module |

C = Light Blue

C = Light Purple

C = Light Blue

COLOR-CODING TECHNIQUE FOR SLOT SELECTION IN BLADED SYSTEMS

BACKGROUND OF THE INVENTION

1. Field of the Invention

Embodiments of the present invention generally relate to bladed systems having slots. More particularly, embodiments of the present invention relate to technique for selecting a slot for inserting therein a blade.

2. Related Art

Advancements in computer technology have made bladed systems very popular. A bladed system is a computing system having a card cage, a backplane, and a plurality of slots, each slot for inserting therein a blade (or printed circuit card) which electrically couples to the backplane. The bladed system design allows multiple configurations and supports reconfigurations. For example, new blades can replace nonfunctioning blades. Moreover, upgraded blades can replace blades based on older technologies.

The CompactPCI Specification was developed to provide a computing architecture standard for bladed systems in industrial environments. In particular, High Availability computer systems are typically bladed systems based on the CompactPCI Specification. These High Availability computer systems are vital to many businesses of all types. Computer-based Enterprise resource, Virtual Private Networks, and Internet commerce services such as E-mail and Web servicing are commonplace requirements in the modern business world and supported by CompactPCI-based bladed systems.

Typically, the blade has a bulkhead that forms the exterior of the bladed system once the blade is inserted into a slot of the bladed system. The blade can have one of a variety of functions, such as data processing, storage, networking, background activity, etc. While the physical form factor of the card cage may be the same at each slot position of the bladed system, the slot positions are not identical in their electronic compatibility with respect to the backplane. That is, certain blades must be placed in certain slots of the bladed system.

According to the CompactPCI Specification, the slots are identified with numbers and a standard reference glyph from a set of standard reference glyphs, whereas the standard reference glyph is a graphical identifier for visual indication of backplane connector and blade compatibility. Moreover, the blade is marked with a standard reference glyph. In practice, the blade should be inserted in the slot whose standard reference glyph is compatible with the standard reference glyph of the blade. However, the numbers and the standard reference glyphs are difficult to read, particularly in reduced light situations where bladed systems may be operating. Moreover, the standard reference glyphs do not create a one-to one correspondence between the slot and the blade. For example, some standard reference glyphs on the slot and some standard reference glyphs on the blade may not be the same, but yet the slot and the blade may be compatible. Hence, prior knowledge is required of the standard reference glyphs to enable correct interpretation of the standard reference glyphs on the slots and blades.

Therefore, the typical prior art slot selection scheme is problematic and suffers different drawbacks. This slot selection scheme creates a high probability that a blade will be inserted in the incorrect slot, causing damage to the bladed system. Moreover, once the blades are inserted, it is difficult to quickly determine what kinds of blades are inserted in the bladed system.

SUMMARY OF THE INVENTION

A method of color-coding a blade and a bladed system is disclosed. The bladed system has a plurality of slots. In particular, the method facilitates selecting at least one slot for inserting therein the blade. One of a plurality of core colors is associated with each slot of the bladed system, whereas each core color indicates which type of blade can be inserted in the corresponding slot. One of the core colors is associated with the blade. In the bladed system, a slot which has an associated core color which matches the core color of the blade is selected. The blade is inserted in the selected slot.

BRIEF DESCRIPTION OF THE DRAWINGS

The accompanying drawings, which are incorporated in and form a part of this specification, illustrate embodiments of the invention and, together with the description, serve to explain the principles of the present invention.

FIG. 1 illustrates a table depicting a color-coding technique in accordance with an embodiment of the present invention.

Figure 2A:
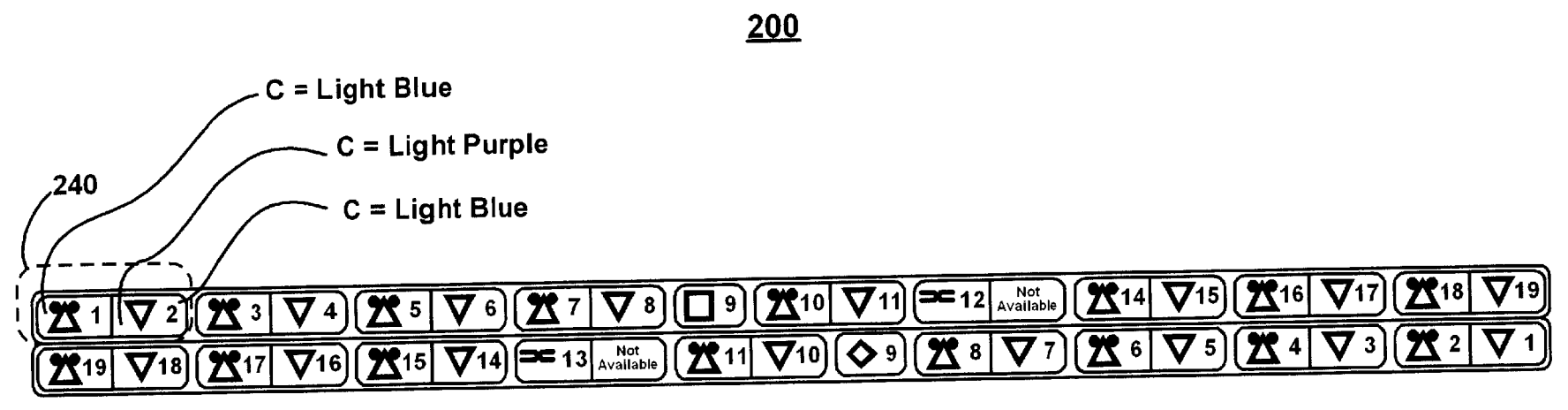

FIG. 2A illustrates a plurality of slot color labels in accordance with an embodiment of the present invention.

DETAILED DESCRIPTION OF THE INVENTION

Figure 2B:
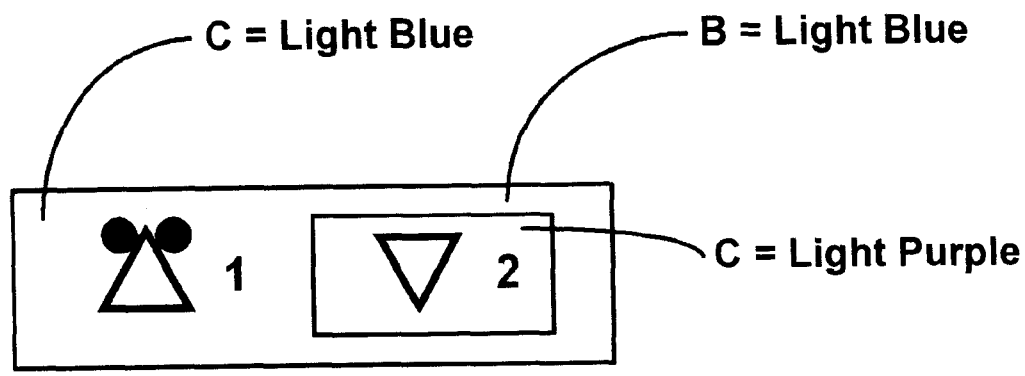
FIG. 2B illustrates a slot color label in greater detail in accordance with an embodiment of the present invention.

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention.

According to the color-coding technique, the blade and the slots of the bladed system are identified with one of a plurality of core colors. Slot selection is simplified and frustration and the possibility of damaged blades are minimized. In particular, a slot whose core color matches the core color of the blade is selected. Then, the blade is inserted in the selected slot.

FIG. 1 illustrates a table 100 depicting a color-coding technique in accordance with an embodiment of the present invention. Although the discussion will focus on the CompactPCI Specification, it should be understood that the present invention is applicable to bladed systems that are based on other standards.

Each row of the table 100 corresponds to a separate type of blade. As described above, each slot of the bladed system is compatible with certain types of blades. The table 100 includes a first column 10 representing the set of standard reference glyphs of the CompactPCI Specification, whereas the standard reference glyphs are used to indicate the type of blade. Moreover, the table 100 includes a second column 20 representing a set of new glyphs that can be applied to the blades and the slots of the bladed systems for slot selection, whereas the new glyphs are used to indicate the type of blade. The table 100 also has a third column 30 representing the color-coding indication corresponding to the glyphs of column 10 and 20 and to indicate the type of blade. The colors of column 30 can be applied to the blade and the slots of the bladed system to facilitate slot selection. Furthermore, the table 100 has a fourth column 40 representing a description of the type of blade associated with each row.

While the CompactPCI Specification combines separate glyphs to create another glyph (e.g., column 10 at row 51, column 10 at row 54, and column 10 at row 54A), the set of new glyphs (Column 20) provides separate glyphs to create another glyph (e.g., column 20 at row 51, column 20 at row 54, and column 20 at row 54A). Hence, prior knowledge is not required of the new glyphs to enable correct interpretation of the new glyphs on the slots and the blades.

As depicted in FIG. 1, the color-coding scheme uses these core colors for indicating the type of blade: light green, light blue, flint gray, pewter gray, and light purple. The core colors are applied to the blades and the slots of the bladed system. The number of core colors in the color-coding scheme depends on a) the number of different types of blades that will be inserted into the slots of the bladed system and on b) the number of different widths associated with the blades. For example, if the blade is a single slot-width, the blade is inserted into one slot. However, if the blade is a double slot-width, the blade is inserted into two adjacent slots. Here, the same core color can be used in rows 53 and 54 because the blade corresponding to row 53 is inserted in a single slot while the blade corresponding to row 54 is inserted in two adjacent slots. It should be understood that the number of core colors and the actual colors of the color-coding scheme can be different than that depicted in FIG. 1.

FIG. 2A illustrates a plurality of slot color labels 200 in accordance with an embodiment of the present invention. Each slot color label includes a glyph, a slot number, and a core color associated with the corresponding slot, whereas the core color indicates the type of blade that can be inserted in the corresponding slot. Some of the slot color labels (e.g., slot color label 240) also have a boundary color associated with the corresponding slot, whereas the boundary color indicates the additional type of blade that can be inserted in the corresponding slot. The glyph provides additional visual indication of the type of blade. The core color of each slot color label can be determined by referring to the columns 20 and 30 of the table 100 of FIG. 1. The slot color labels 200 are divided into two rows of slot color labels. In an embodiment, the top row of slot color labels is applied to the slots on the front side of the bladed system while the bottom row of slot color labels is applied to the slots on the rear side of the bladed system.

FIG. 2B illustrates a slot color label 240 of FIG. 2A in greater detail in accordance with an embodiment of the present invention. As shown in FIG. 2B, slot 1 has the core color light blue while the slot 2 has the core color light purple. In addition, the slot 2 has the boundary color light blue. Typically, the boundary color of a slot matches the core color of an adjacent slot. The boundary color of slot 2 surrounds the core color of slot 2, whereas the boundary color indicates which additional type of blade can be inserted in the slot 2. Hence, the slot color label 240 indicates that a single slot-width blade having the core color light blue can be inserted in slot 1, a single slot-width blade having the core color light purple can be inserted in slot 2, and a double slot-width blade having the core color light blue can be inserted in adjacent slots 1 and 2.

Figure 3:
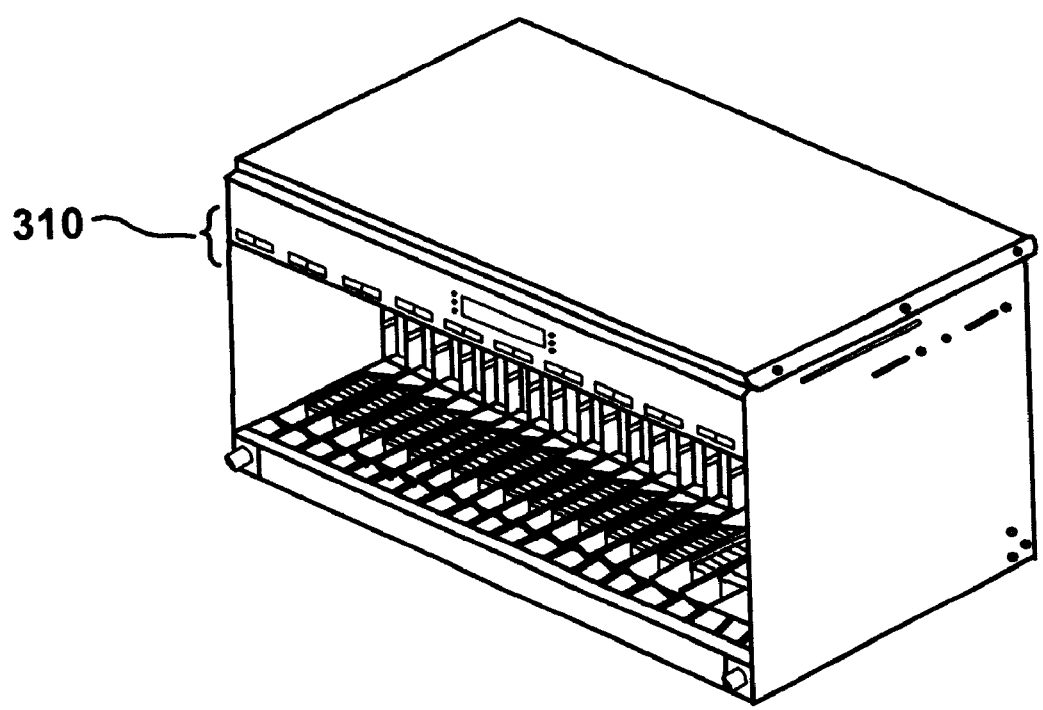
FIG. 3 illustrates a bladed system in accordance with an embodiment of the present invention.

A bladed system 300 in accordance with an embodiment of the present invention is depicted in FIG. 3. The bladed system 300 has a plurality of slots for inserting therein a blade. Moreover, the bladed system 300 has a line of slot color labels 310, whereas each slot color label corresponds with one of the slots. Although a slot color label is shown in FIG. 3, it should be understood that the core colors of the color-coding scheme can be implemented as any other type of core color indicator.

Figure 4:
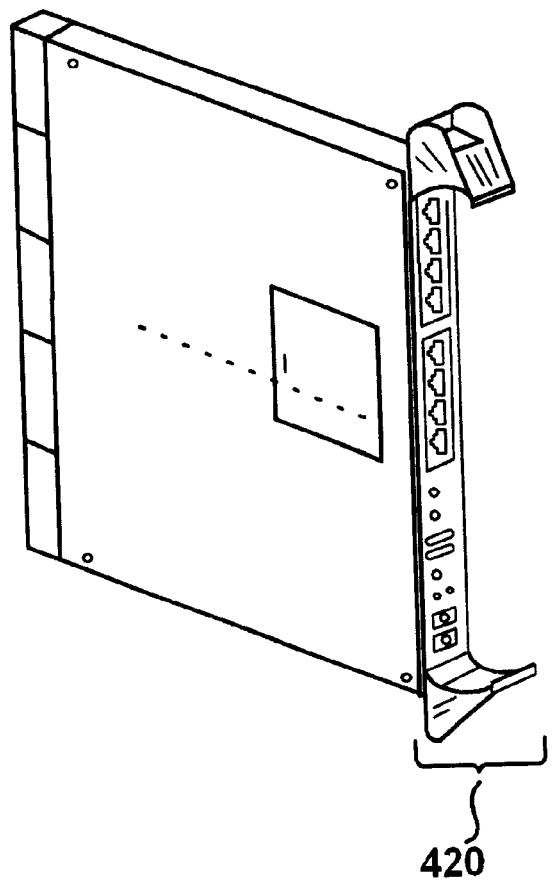
FIG. 4 illustrates a blade in accordance with an embodiment of the present invention.

A blade 400 in accordance with an embodiment of the present invention is illustrated in FIG. 4. The blade 400 includes a bulkhead 420. In an embodiment, a blade color label is applied to the bulkhead 420, whereas the blade color label has a core color (see table 100 of FIG. 1) indicating the type of blade. Although a blade color label is implemented in an embodiment of the present invention, it should be understood that the core colors of the color-coding scheme can be implemented as any other type of core color indicator.

Figure 5:
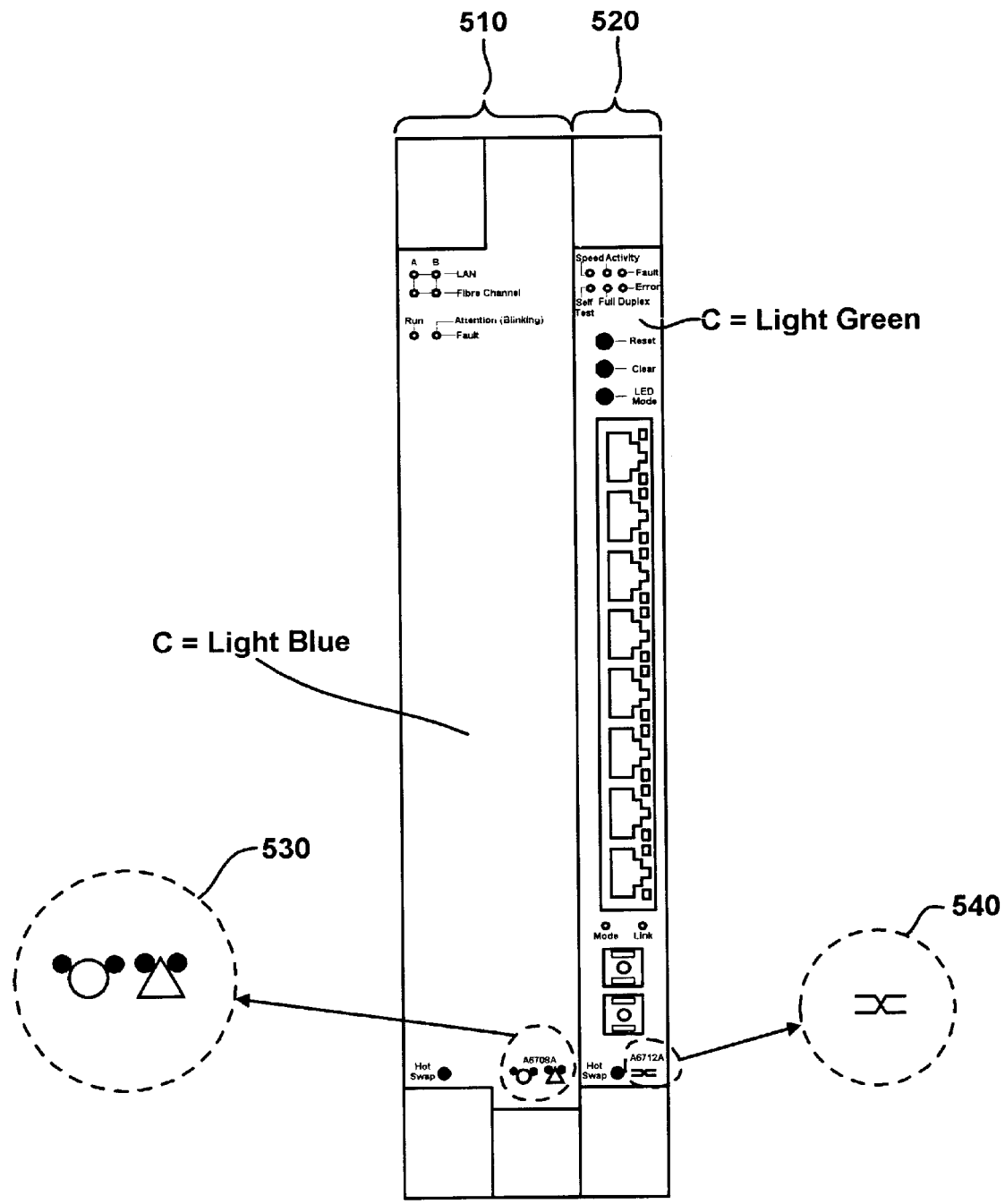
FIG. 5 illustrates a first bulkhead and a second bulkhead in accordance with an embodiment of the present invention.
Figure 6:
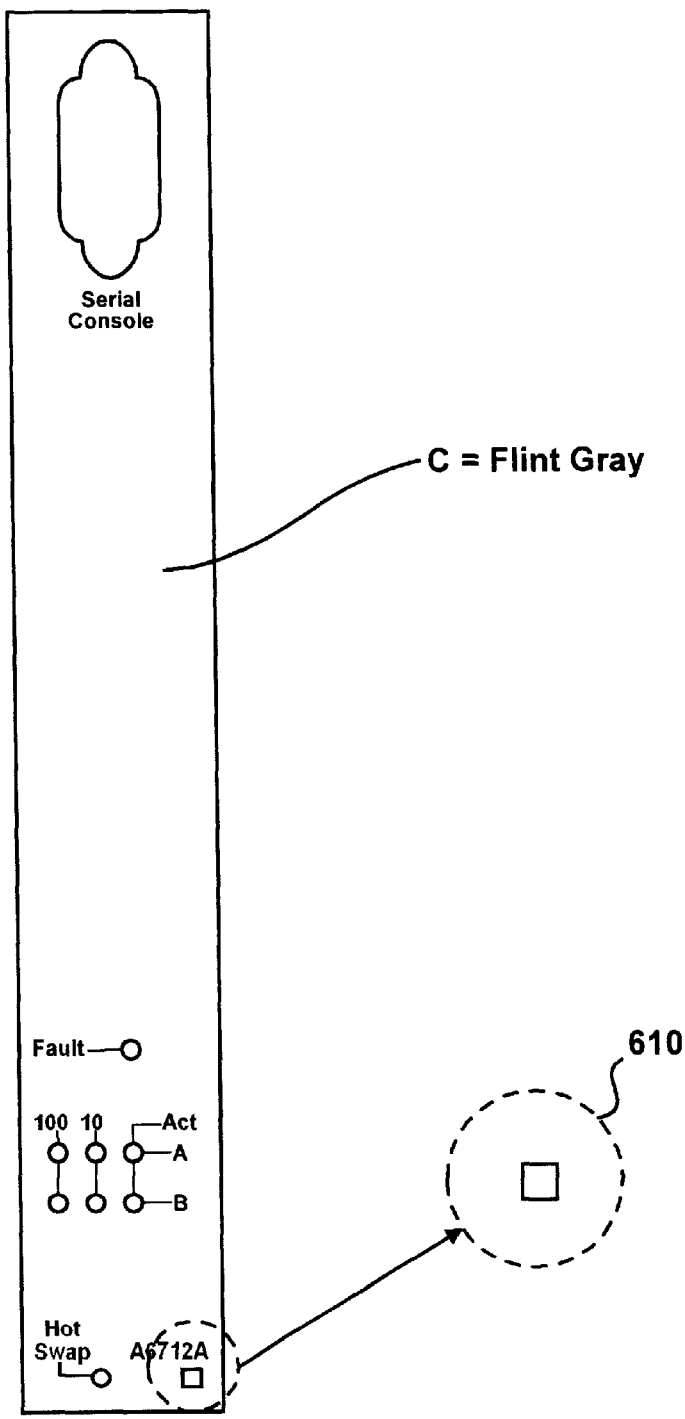
FIG. 6 illustrates a third bulkhead in accordance with an embodiment of the present invention.

FIG. 5 illustrates a first bulkhead 510 and a second bulkhead 520 in accordance with an embodiment of the present invention. The first bulkhead 510 belongs to a double slot-width blade. Moreover, the first bulkhead 510 has a blade color label that includes a glyph 530 (see row 54 of table 100 of FIG. 1) and a core color indicating the type of blade, whereas the core color is light blue. The glyph provides additional visual indication of the type of blade. The second bulkhead 520 belongs to a single slot-width blade. Moreover, the second bulkhead 520 has a blade color label that includes a glyph 540 (see row 52 of table 100 of FIG. 1) and a core color indicating the type of blade, whereas the core color is light green. Additionally, FIG. 6 illustrates a third bulkhead 600 in accordance with an embodiment of the present invention. The third bulkhead 600 belongs to a single slot-width blade. Moreover, the third bulkhead 600 has a blade color label that includes a glyph 610 (see row 55 of table 100 of FIG. 1) and a core color indicating the type of blade, whereas the core color is flint gray.

In practice, the color-coding scheme simplifies the slot selection process. The core color of the blade is determined by referring to the bulkhead of the blade. In the case of a single slot-width blade, a slot that has an associated core color which matches the core color of the blade is selected. In the case of a double slot-width blade, a first adjacent slot and a second adjacent slot are selected such that the first adjacent slot has an associated core color which matches the core color of the blade and such that the second adjacent slot has an associated boundary color which matches the core color of the blade. Next, the blade is inserted in the selected slot(s).

Additionally, the color-coding scheme is user-friendly. Also, the color-coding scheme provides the added benefit of allowing a user to easily and quickly determine what kinds of blades are inserted in the bladed system by the color variation that is visible. Moreover, the color-coding scheme minimizes the chance of inserting a blade into an incorrect slot, frustration, and the possibility of damaged blades due to incorrect slot insertion.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method of color-coding a blade and a bladed system having a plurality of slots to facilitate selecting at least one slot for inserting therein said blade, said method comprising:

associating one of a plurality of core colors with each slot of said bladed system, wherein each core color indicates which type of blade can be inserted in said corresponding slot;

associating one of said core colors with said blade;

selecting said slot which has an associated core color which matches said core color of said blade; and inserting said blade in said selected slot, wherein said core color of said blade and said core color of said selected slot are readily visible when said blade is in an inserted position in said selected slot.

2. The method as recited in claim 1 further comprising:

associating one of a plurality of boundary colors with each one of selective slots of said bladed system, wherein each boundary color indicates which additional type of blade can be inserted in said selective slot, and wherein said boundary color surrounds said core color of said selective slot.

3. The method as recited in claim 2 wherein said boundary color of said selective slot matches said core color of an adjacent slot.

4. The method as recited in claim 2 wherein if said blade requires a first slot and a second slot, said step of selecting said slot includes:

selecting a first adjacent slot and a second adjacent slot such that said first adjacent slot has an associated core color which matches said core color of said blade and such that said second adjacent slot has an associated boundary color which matches said core color of said blade.

5. The method as recited in claim 1 further comprising:

associating at least one of a plurality of readily interpretable glyphs with each slot of said bladed system, wherein each readily interpretable glyph indicates which type of blade can be inserted in said corresponding slot; and associating at least one of said readily interpretable glyphs with said blade.

6. The method as recited in claim 1 wherein said step of associating one of said plurality of core colors with each slot includes:

for each slot, placing a colored label having said core color on said bladed system.

7. The method as recited in claim 1 wherein said step of associating one of said core colors with said blade includes:

placing a colored label having said core color on a bulkhead of said blade.

8. The method as recited in claim 1 wherein said core colors includes light green, light blue, flint gray, pewter gray, and light purple.

9. A blade for inserting in at least one slot of a bladed system, comprising:

a bulkhead; and a core color indicator which is one of a plurality of core colors each indicating type of blade, wherein said core color indicator is located on said bulkhead, and wherein said core color indicator is readily visible when said blade is in an inserted position in a slot having a corresponding core color indicator.

10. The blade as recited in claim 9 further comprising at least one of a plurality of readily interpretable glyphs each indicating type of blade.

11. The blade as recited in claim 9 wherein said core color indicator comprises a colored label having said core color.

12. The blade as recited in claim 9 wherein said core colors includes light green, light blue, flint gray, pewter gray, and light purple.

13. A bladed system comprising:

a plurality of slots; and a plurality of first core color indicators each being one of a plurality of core colors, wherein each first core color indicator corresponds with one of said slots, wherein each first core color indicates which type of blade can be inserted in said corresponding slot, wherein said blade has a core color indicator, and wherein said first core color indicator and said core color indicator are readily visible when said blade is in an inserted position in said corresponding slot.

14. The bladed system as recited in claim 13 further comprising:

a first blade inserted in at least one selected slot, said first blade comprising:

a bulkhead; and a second core color indicator which is one of said core colors, wherein said second core color indicator is located on said bulkhead, and wherein said first core color indicator of said selected slot matches said second core color indicator of said first blade.

15. The bladed system as recited in claim 14 further comprising:

a plurality of boundary color indicators each being one of a plurality of boundary colors, wherein each boundary color indicator corresponds with one of selective slots, wherein each boundary color indicator indicates which additional type of blade can be inserted in said selective slot, and wherein each boundary color indicator surrounds said core color indicator of said selective slot.

16. The bladed system as recited in claim 15 wherein said boundary color indicator of said selective slot matches said core color indicator of an adjacent slot.

17. The bladed system as recited in claim 15 wherein if said first blade requires a first selected slot and a second selected slot, a first adjacent slot and a second adjacent slot are selected such that said first core color indicator of said first adjacent slot matches said second core color indicator of said first blade and such that said boundary color indicator of said second adjacent slot matches said second core color indicator of said first blade.

18. The bladed system as recited in claim 14 further comprising a plurality of readily interpretable glyphs each corresponding with one of said slots, wherein each readily interpretable glyph indicates which type of blade can be inserted in said corresponding slot, and wherein said first blade further comprises at least one of said readily interpretable glyphs.

19. The bladed system as recited in claim 14 wherein said second core color indicator comprises a colored label having said core color.

20. The bladed system as recited in claim 13 wherein each first core color indicator comprises a colored label having said core color.

21. The bladed system as recited in claim 13 wherein said core colors includes light green, light blue, flint gray, pewter gray, and light purple.

* * * * *